(12) United States Patent
Tanaka

(10) Patent No.: US 7,389,203 B2
(45) Date of Patent: Jun. 17, 2008

(54) METHOD AND APPARATUS FOR DECIDING CAUSE OF ABNORMALITY IN PLASMA PROCESSING APPARATUS

(75) Inventor: Hideki Tanaka, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 842 days.

(21) Appl. No.: 10/849,307

(22) Filed: May 20, 2004

(65) Prior Publication Data

US 2005/0006344 A1 Jan. 13, 2005

(30) Foreign Application Priority Data

May 21, 2003 (JP) .............................. 2003-143887

(51) Int. Cl.
*G06F 15/00* (2006.01)
*G06F 11/30* (2006.01)

(52) U.S. Cl. ....................................... 702/185; 702/183

(58) Field of Classification Search ................ 702/182, 702/183, 185, 189; 700/95, 121; 156/354.24
See application file for complete search history.

(56) References Cited

U.S. PATENT DOCUMENTS 7,263,463 B2 * 8/2007 Yamazaki .................... 702/182

FOREIGN PATENT DOCUMENTS

JP 11-087323 3/1999

\* cited by examiner

*Primary Examiner*—Bryan Bui
(74) *Attorney, Agent, or Firm*—Finnegan, Henderson, Farrabow, Garrett & Dunner, L.L.P.

(57) ABSTRACT

Analysis data constituted by a plurality of parameters is acquired on the basis of detection values obtained in processes for an object to be processed from a detector arranged in a plasma processing apparatus. With respect to parameters of analysis data decided as abnormal data, as a degree of influence on abnormality, a contribution to, e.g., a residual score is calculated (degree-of-influence calculating step). Contributions of the parameters are set at 0 or a value close to 0 in a descending order of contribution of the parameters to sequentially calculate residual scores, and, when the residual scores are not more than a predetermined value, the parameters having the contributions which are set at 0 or a value close to 0 until now as parameters which cause abnormality (cause-of-abnormality deciding step).

8 Claims, 8 Drawing Sheets

126th WAFER

140th WAFER

150th WAFER

METHOD AND APPARATUS FOR DECIDING CAUSE OF ABNORMALITY IN PLASMA PROCESSING APPARATUS

BACKGROUND OF THE INVENTION

1. Field of the Invention

The invention relates to a method and apparatus for deciding a cause of abnormality in a plasma processing apparatus.

2. Description of the Related Art

In the steps in manufacturing a semiconductor, manufacturing apparatuses and inspection apparatuses of various types are used. For example, a plasma processing apparatus performs an etching process, a film forming process, and the like to an object to be processed such as a semiconductor wafer or a glass substrate by generating a plasma in a processing chamber. These processing apparatuses have a large number of parameters to control or monitor the operation states of the processing apparatuses. The processing apparatuses the operation states to make it possible to various processes under optimum conditions. As the parameters, temperatures of an upper electrode, a lower electrode, and the like arranged in a processing chamber.

When processes are performed by the above plasma processing apparatus, the plasma processing apparatus is controlled such that the processes can be always optimally performed while monitoring the parameters by detectors, respectively. At this time, the number of parameters comes to several tens. For this reason, when an abnormality is recognized in an operation state, a cause of abnormality is very difficult to be found out.

For example, in Japanese Patent Laid-open Publication No. 11-87323, the following technique is disclosed. That is, a plurality of process parameters of a semiconductor wafer processing system are analyzed to correlate the parameters to each other as analysis data, thereby detecting changes of process characteristics and system characteristics.

The following method is also known. That is, the plurality of parameters are held together into a smaller number of statistical data as analysis data by using a method of analyzing a principal component which is one of multivariate analyses. Operation states of a processing apparatus is monitored on the basis of the small number of statistical data to evaluate the operation states.

In such a conventional method, for example, analysis data is subjected to, e.g., a principal component analysis on the basis of the statistical analysis result obtained by the principal component analysis to calculate a residual score. The residual score is a predetermined value or more, it is decided that the analysis data is abnormal.

However, by the above methods, it can be decided whether the analysis data is abnormal or not. Of the parameters constituting the analysis data, a parameter which causes an abnormality cannot be specified.

With respect to this point, when degrees of contribution of the parameters in the analysis data are calculated to a residual score, a specific parameter which causes an abnormality can be known to some extent. More specifically, since a parameter having a high contribution largely contributes to a residual score of a part decided as an abnormal part, a parameter having a high contribution is abnormal with high probability.

However, a specific parameter cannot be decided as an abnormal parameter due to the contribution of a residual score. For this reason, a parameter which causes an abnormality cannot be appropriately specified.

SUMMARY OF THE INVENTION

Therefore, the present invention has been made in consideration of the above problems, and has as its object to provide a method and apparatus for deciding a cause of abnormality in a plasma processing apparatus to make it possible to appropriately specify a parameter of analysis data which causes an abnormality.

In order to solve the above object, according to the first aspect of the present invention, there is provided a method of deciding a cause of abnormality in a plasma processing apparatus which performs a plasma processing to an object to be processed in a processing chamber, including: the analysis data acquiring step of acquiring analysis data constituted by a plurality of parameters on the basis of detection values obtained in processes for the object from a detector arranged in the plasma processing apparatus; the abnormality deciding step of analyzing the acquired analysis data to decide whether the analysis data is abnormal or not; the degree-of-influence calculating step of calculating degrees of influence on the abnormality of each parameter of the analysis data decided as abnormal data; and the cause-of-abnormality deciding step of deciding whether the analysis data is abnormal or not after removing the influences on the abnormality from the parameter sequentially in the descending order of the degrees of influence of the parameters, and then deciding the parameters from which the influences on the abnormality are removed up to now as parameters which cause the abnormality when it is decided that the analysis data is normal.

In order to solve the above problem, according to the second aspect of the present invention, there is provided an apparatus for deciding a cause of abnormality in a plasma processing apparatus which performs a plasma processing to an object to be processed in a processing chamber, including: analysis data acquiring means for acquiring analysis data constituted by a plurality of parameters on the basis of detection values obtained in processes for the object from a detector arranged in the plasma processing apparatus; abnormality deciding means for analyzing the acquired analysis data to decide whether the analysis data is abnormal or not; degree-of-influence calculating means for calculating degrees of influence on the abnormality of each parameter of the analysis data decided as abnormal data; and cause-of-abnormality deciding means for deciding whether the analysis data is abnormal or not after removing the influences on the abnormality from the parameter sequentially in the descending order of the degrees of influence of the parameters, and then deciding the parameters from which the influences on the abnormality are removed up to now as parameters which cause the abnormality when it is decided that the analysis data is normal.

In the first and second aspects of the present invention, since a parameter can be specified depending on a degree of influence on an abnormality can be specified, a parameter which causes an abnormality can be appropriately decided. For this reason, since repair or maintenance required to decide the analysis data as normal data can be appropriately performed, the repair or the maintenance can be made efficient.

In the abnormality decision in the method and apparatus, principal component analysis is performed to the acquired analysis data to calculate a residual score, and analysis data the residual score of which exceeds a predetermined value is decided as abnormal data. In the calculation of degrees of influence, degrees of contribution to the residual score are calculated as the degrees of influence on the abnormality with respect to parameters of the analysis data decided as abnormal data. In the decision of a cause of abnormality, residual scores are sequentially calculated in the descending order of the degrees of contribution of the parameters such that the degrees of contribution of the parameters are set to be 0 or a value close to 0, and when the residual scores are the predetermined value or less, the parameters the degrees of contribution of which are set to be 0 or a value close to 0 may be decided as parameters which cause the abnormality. According to this, since a parameter can be specified depending on a residual score obtained by a principal component analysis, the parameter which causes an abnormality can be appropriately decided.

In the decision of a cause of abnormality in the method and apparatus, in order to set the contribution of a specific parameter to be 0 or a value close to 0, a correlation between the specific parameter and another parameter is calculated by a multivariate analysis, e.g., a partial least squares method, a predicted value of the specific parameter is calculated on the basis of the correlation, and the value of the specific parameter may be replaced with the predicted value. In this manner, even though a new special computing method is not made, the contribution of the specific parameter can be set to be 0 or a value close to 0.

DETAILED DESCRIPTION OF THE PREFERRED EMBODIMENTS

Figure 1:
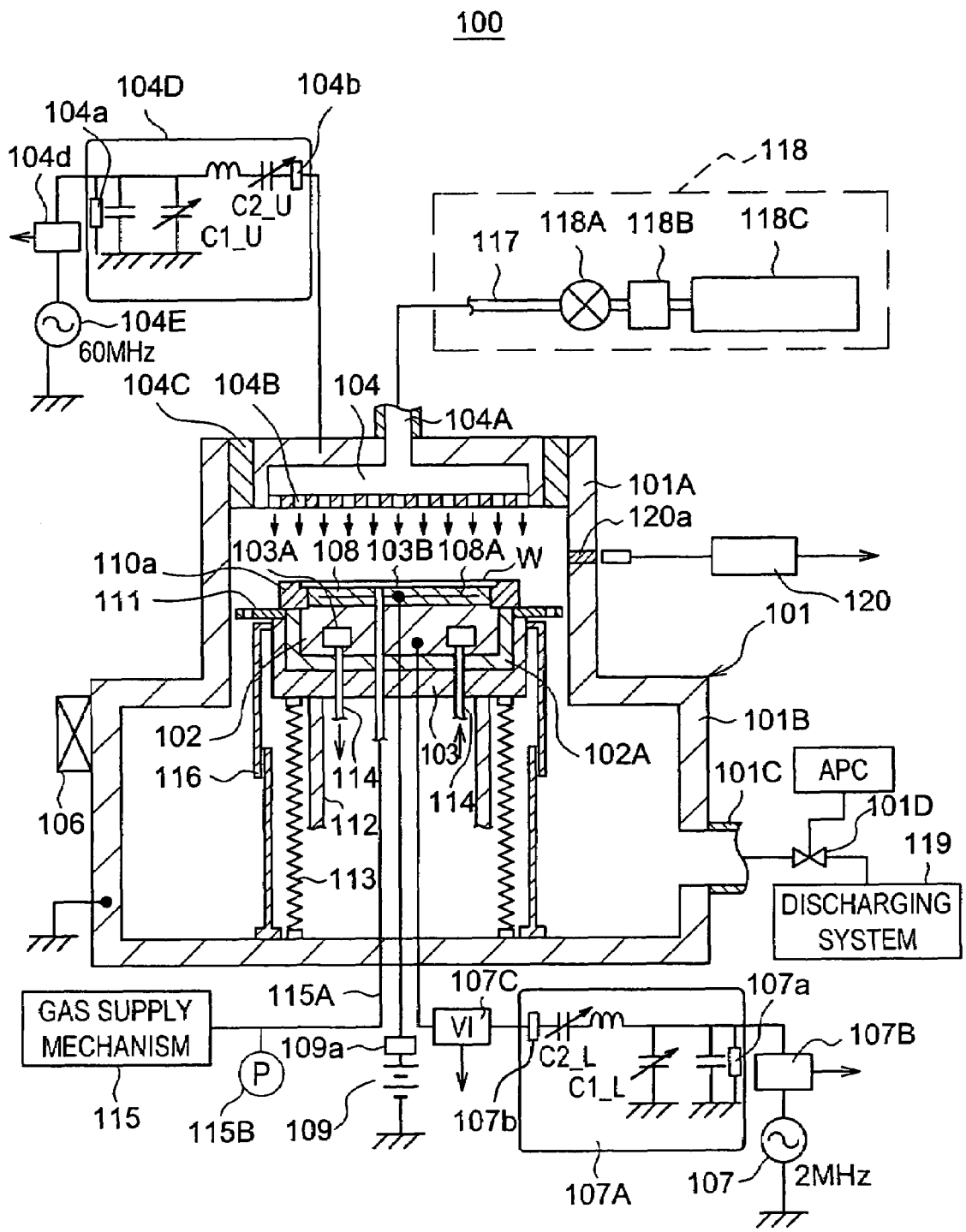
FIG. 1 is a schematic diagram showing a plasma processing apparatus according to an embodiment of the present invention.

Preferred embodiments of an apparatus according to the present invention will be described below with reference to the accompanying drawings. The same reference numerals as in the specification and the drawings denote constituent elements substantially having the same functions in the specification and the drawings.

(Plasma Processing Apparatus)

A plasma processing apparatus 100 according to the first embodiment will be described below. The plasma processing apparatus 100, as shown in FIG. 1, comprises an aluminum processing chamber 101, an aluminum support member 103 that supports a lower electrode 102 arranged in the processing chamber 101 through an insulator 102A and that can be vertically moved, and a shower head (to be also referred to as an "upper electrode" hereinafter) 104 that is arranged, supplies a process gas, and also serves as an upper electrode. The shower head 104 insulated from the processing chamber 101 through an insulator 104C.

A high-frequency power supply 104E is connected to the shower head 104 through a rectifier 104D. The first high-frequency power supply 104E has a frequency falling within the range of, e.g., 50 to 150 MHz. In this manner, when a high-frequency power is applied, a high-density plasma can be formed with a preferable dissociation state in the processing chamber 101 to make it possible to perform a plasma processing at a pressure lower than a conventional pressure. The pressure of the first high-frequency power supply 104E preferably falls within the range of 50 to 80 MHz. Typically, a frequency of 60 MHz (not shown) or an approximate frequency is employed.

In the rectifier 104D on the shower head 104 side, a measuring unit 104b which measures a high-frequency (RF) voltage Vpp on the shower head 104 side (output side of the high-frequency voltage) is arranged. More specifically, for example, two variable capacitors C1_U and C2_U, a capacitor C, and a coil L are incorporated to achieve impedance matching through variable capacitors C1_U and C2_U.

The rectifier 104D comprises a voltmeter 104a. A voltage Vdc between a supply line (electric wire) for a first high-frequency power and the ground of the plasma processing apparatus 100 can be measured by the voltmeter 104a.

A first high-frequency power P from the first high-frequency power supply 104E is measured by the voltmeter 104d connected to the upper electrode 104 side (output side of the high-frequency power) of the rectifier 104D.

A detection window 120a is arranged on the side wall of the processing chamber 101, and a spectroscope (to be referred to as an "optical measuring unit" hereinafter) 120 that detects plasma emission in the processing chamber 101 through the detection window 120a is arranged outside the side wall of the processing chamber 101. An emission spectrum intensity of a wavelength detected from the spectroscope 120 is used as optical data.

In the processing chamber 101, a chamber 101A having an upper small-diameter part is formed as an upper part, and a chamber 101B having a lower large-diameter part is formed as a lower part. An inlet/outlet port which is used to carry the wafer W out of or into a lower chamber 101B is formed in the upper part of the lower chamber 101B, and a gate valve 106 is attached to the outlet/inlet port.

A second high-frequency power supply 107 is connected to the lower electrode 102 through an electric measuring unit 107C (for example, a VI probe), a rectifier 107A, and a voltmeter 107B. The second high-frequency power supply 107 has a frequency falling within the range of several hundred kHz to ten and several MHz. When the power having the frequency falling within such a range is applied, ionic action can be appropriately achieved without damaging the wafer W serving as an object to be processed. The frequency of the second high-frequency power supply 107, an illustrated frequency of 2 MHz is typically employed.

The rectifier 107A on the lower electrode 102 side is constituted like the voltmeter 104D on the upper electrode 104 side. More specifically, in the rectifier 107A, a measuring unit 107b that measures the high-frequency (RF) voltage Vpp on the lower electrode 102 side (output side of a high-frequency voltage) is arranged. The rectifier 107A, more specifically, incorporates, e.g., two variable capacitors C1_L and C2_L, a capacitor C, and a coil L to achieve impedance matching through the variable capacitors C1_L and C2_L.

The rectifier 107D comprises a voltmeter 107a. A voltage Vdc between a supply line (electric wire) for a second high-frequency power and the ground of the plasma processing apparatus 100 can be measured by the voltmeter 107a.

A second high-frequency power P from the second high-frequency power supply 107 is measured by the voltmeter 107B connected to the lower electrode 102 side (output side of the high-frequency power) of the rectifier 107A.

High-frequency voltages (V), high-frequency currents (I), high-frequency phases (P), and impedances (Z) of a fundamental wave (for example, a traveling wave and a reflected wave of a high-frequency power) and a harmonic wave based on a plasma generated in the upper chamber 101A can be detected as electric data by the high-frequency power P applied to the lower electrode 102 through the electric measuring unit (for example a VI probe) 107C. In this embodiment, the electric data such as the voltages (V), the currents (I), the phases (P), and the impedances (Z) of the fundamental wave and the harmonic wave is used as operation data in prediction.

On the upper surface of the lower electrode 102, an electrostatic chuck 108 is arranged. A DC power supply 109 is connected to an electrode plate 108A of the electrostatic chuck 108. According to the electrostatic chuck 108, a high voltage is applied from the DC power supply 109 to the electrode plate 108A in a high vacuum state to make it possible to electrostatically adsorb the wafer W. A volt/ampere meter 109a which detects an applied current and an applied voltage of the electrostatic chuck 108 is connected between the electrode plate 108A and the DC power supply 109 of the electrostatic chuck 108.

A focus ring 110a is arranged on the periphery of the lower electrode 102 to collect a plasma generated in the upper chamber 101A on the wafer W. A discharge ring 111 attached to the upper portion of the support member 103 is arranged below the focus ring 110a. A plurality of holes are formed on the entire periphery of the discharge ring 111 at equal intervals in the circumferential direction, and the gas in the upper chamber 101A is discharged to the lower chamber 101B through the holes.

The support member 103 can be vertically moved between the upper chamber 101A and the lower chamber 101B through a ball screw mechanism 112 and a bellows 113. Therefore, when the wafer W is supplied onto the lower electrode 102, the lower electrode 102 moves down to the lower chamber 101B through the support member 103, and the gate valve 106 is released to supply the wafer W onto the lower electrode 102 through a carry mechanism (not shown).

A coolant flow path 103A connected to a coolant pipe 114 is formed in the support member 103. A coolant is circulated in the coolant flow path 103A through the coolant pipe 114 to control the temperature of the wafer W to a predetermined temperature.

Gas flow paths 103B are formed in the support member 103, the insulator 102A, the lower electrode 102, and the electrostatic chuck 108, respectively. For example, an He gas is supplied as a back-side gas from a gas feeding mechanism 115 into a gap between the electrostatic chuck 108 and the wafer W through a gas pipe 115A to increase the heat conductivity between the electrostatic chuck 108 and the wafer W through the He gas. The pressure of the back-side gas is detected by a pressure sensor (not shown), and the detection value is displayed on a pressure meter 115B. Reference numeral 116 denotes a bellows cover. A mass flow controller (not shown) is arranged on the gas feeding mechanism 115. The mass flow controller can detect a gas flow rate of the back-side gas.

A gas feeding unit 104A is formed on the upper surface of the upper electrode 104. A process gas supply system 118 is connected to the gas feeding unit 104A through a pipe 117. The process gas supply system 118 is formed such that a process gas supplier 118C is connected to the pipe 117 through a valve 118A and a mass flow controller 118B.

From the process gas supplier 118C, a process gas for plasma etching is supplied. FIG. 1 shows only one process gas supply system 118 constituted by the process gas supplier 118C and the like. However, the plurality of process gas supply system may be arranged. In this case, for example, the process gas supply systems are designed such that the flow rates of an $NH_3$ gas, an Ar gas, and the like are independently controlled to be supplied into the processing chamber 101.

A plurality of holes 104B are uniformly formed on the entire lower surface of the upper electrode 104. For example, an $NH_3$ gas is supplied as a process gas from the upper electrode 104 into the upper chamber 101A through the holes 104B.

In FIG. 1, reference numeral 101C denotes a discharge pipe, and reference numeral 119 denotes a discharge system constituted by a vacuum pump and the like connected to the discharge pipe 101C. An APC (Auto Pressure Controller) valve 101D is arranged in the discharge pipe 101C, so that the divergence of the APC valve is automatically regulated depending on a gas pressure in the processing chamber 101.

(Multivariate Analysis Means)

Figure 2:
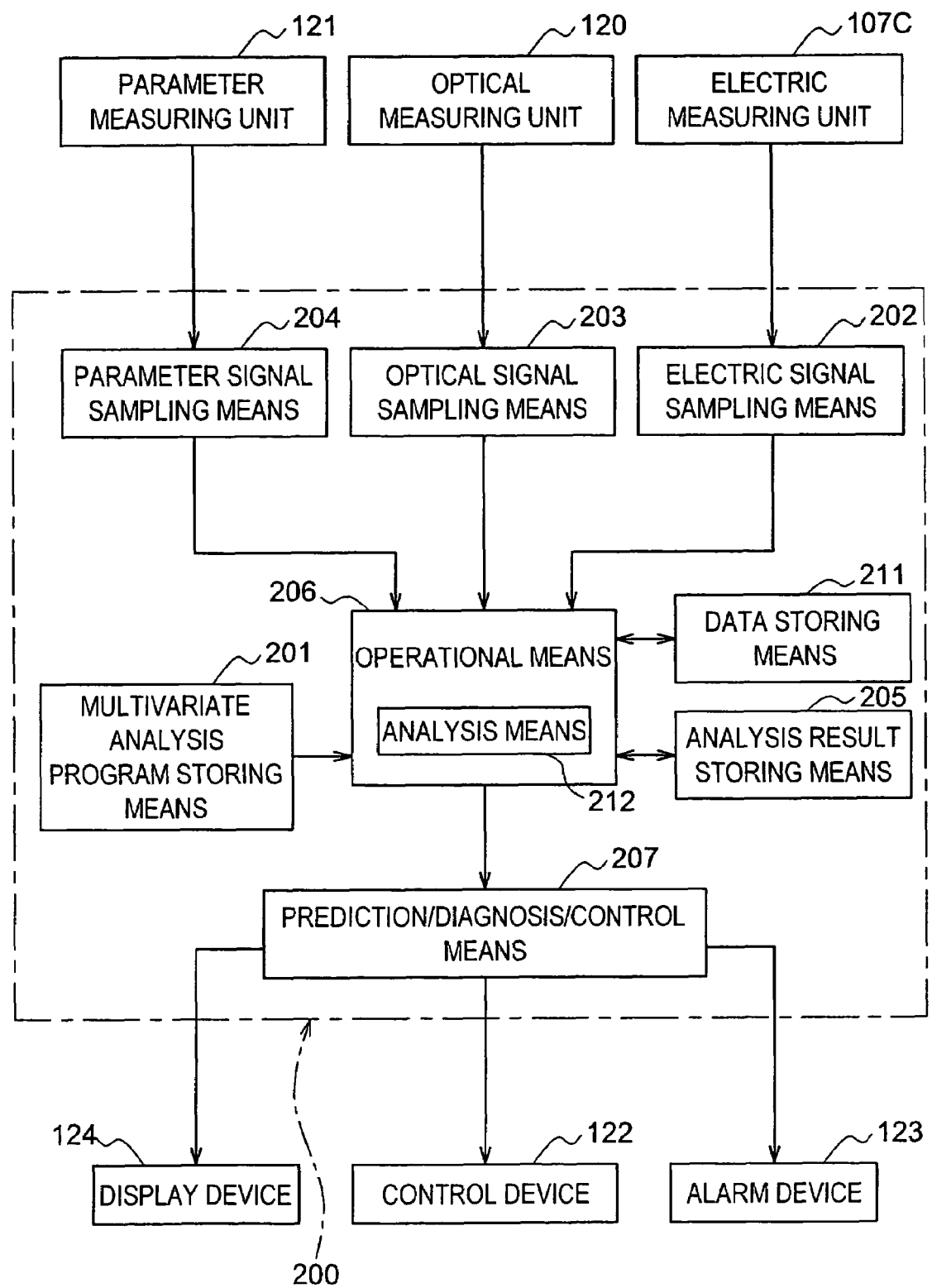
FIG. 2 is a block diagram showing an example of a multivariate analysis unit in the embodiment.

A multivariate analysis means held by the plasma processing apparatus 100 in the embodiment will be described below. A multivariate analysis means 200 also functions as an apparatus for deciding a cause of abnormality of the plasma processing apparatus. The multivariate analysis means 200, for example, as shown in FIG. 2, comprises a multivariate analysis program storing means 201 that stores a multivariate analysis program for a principal component analysis or a partial least squares method, an electric signal sampling means 202 that intermittently samples signals from the electric measuring unit 107C, the spectroscope 120, and a parameter measuring unit 121, an optical signal sampling means 203, and a parameter signal sampling means 204. The data sampled by the sampling means 202, 203, and 204 serve as detection values from the detectors, respectively.

The parameter measuring unit 121 is a measuring unit that measures the control parameters described above. When a multivariate analysis is actually performed, all the data may not be used. The multivariate analysis is performed by using at least one selected from the data from the electric measuring unit 107C, the spectroscope 120, and the parameter measuring unit 121. Therefore, the data from all the measuring units may be used, or data from only the electric measuring unit 107C, the spectroscope 120, or the parameter measuring unit 121. Desired data from the electric measuring unit 107C, the spectroscope 120, and the parameter measuring unit 121 may be combined to each other.

The plasma processing apparatus 100 comprises an analysis result storing means 205 that stores a result of a multivariate analysis such as a model formed by a multivariate analysis, a calculation means 206 that detects (diagnoses) an abnormal value of a predetermined parameter or calculates a predicted value on the basis of the analysis result, a prediction/diagnosis/control means 207 that performs prediction, diagnosis, and control on the basis of a calculation signal from the calculation means 206, and a data storing means 211 that stores analysis data or the like.

A control device 122 that controls the plasma processing apparatus 100, an alarm device 123, and a display device 124 are connected to the multivariate analysis means 200. The control device 122 continues or interrupts processing for the wafer W on the basis of a signal from, for example, the prediction/diagnosis/control means 207. The alarm device 123 and the display device 124 notifies the multivariate analysis means 200 of abnormalities of a control parameter and/or an apparatus state parameter on the basis of a signal from the prediction/diagnosis/control means 207 as described below.

The calculation means 206 comprises an analysis means 212. The analysis means 212, for example, performs a multivariate analysis such as a PCA (Principal Component Analysis) or a PLS method (Partial Least Squares method). The analysis means 212 calculates a residual score obtained by the principal analysis (as will be described later) or calculates degrees of contribution to the residual score with respect to the parameters of the analysis data.

(Abnormality Decision of Analysis Data)

A method of performing an abnormality decision by the analysis means 212 will be described below. The analysis means 212 performs a multivariate analysis such as a principal component analysis to the analysis data to calculate a residual score Q, and an abnormality decision of the analysis data is performed on the basis of the residual score Q.

More specifically, an etching process is performed to wafers located in, e.g., a predetermined zone serving as a reference in advance, detection values detected by the detectors at this time, i.e., detection values such as the high-frequency (RF) voltages Vpp are sequentially detected with respect to the wafers. Analysis data is acquired from the obtained detection values and values obtained by performing a predetermined calculation to the detection values, and is stored in, e.g., the data storing means 211 (analysis data acquiring step and analysis data acquiring means). When K detection values x are present for each of N wafers, a matrix X including the analysis data is expressed by equation (1-1):

$$X = \begin{bmatrix} x_{11} & x_{12} & \cdots & x_{1K} \\ x_{21} & x_{22} & \cdots & x_{2K} \\ \vdots & \vdots & \vdots & \vdots \\ x_{N1} & x_{N2} & \cdots & x_{NK} \end{bmatrix} \quad (1\text{-}1)$$

After an average value, a maximum value, a minimum value, and a variance value are calculated on the basis of the detection values in the calculation means 206, a principal component analysis is performed to the analysis data by using a variance-covariance matrix based on the calculated values to calculate characteristic numbers and characteristic vectors thereof.

The characteristic numbers express the sizes of a variances of the analysis data, and are defined as a first principal component, a second principal component, . . . , the ath principal component in a descending order of the characteristic numbers. Each characteristic number has a characteristic vector which belongs to the characteristic number. In general, a high-order principal component has a high contribution to evaluation of data, and the utility value of the principal component decreases.

For example, K detection values are employed for each of N wafers, the ath principal component corresponding to the ath characteristic number of the nth wafer is expressed by equation (1-2):

$$t_{na} = x_{n1}p_{1a} + x_{n2}p_{2a} + \ldots + x_{nk}p_{Ka} \quad (1\text{-}2)$$

A vector $t_a$ and a matrix $T_a$ of the ath principal score are expressed by equation (1-3), and a characteristic vector $p_a$ and a matrix $P_a$ of the ath principal component are defined by equation (1-4). The vector $t_a$ of the ath principal component score is expressed by equation (1-5) using the matrix X and the characteristic vector $p_a$. When vectors $t_1$ to $t_k$ of principal component scores and characteristic vectors $p_1$ to $p_k$ are used, the matrix X is expressed by equation (1-6). In equation (1-6), $P_k^T$ means a transposed matrix of $P_k$.

$$t_a = \begin{bmatrix} t_{1a} \\ t_{2a} \\ \vdots \\ t_{Na} \end{bmatrix}, T_a = \begin{bmatrix} t_{11} & t_{12} & \cdots & t_{1a} \\ t_{21} & t_{22} & \cdots & t_{2a} \\ \vdots & \vdots & \vdots & \vdots \\ t_{N1} & t_{N2} & \cdots & t_{Na} \end{bmatrix} (a = 1, 2, \ldots, K) \quad (1\text{-}3)$$

$$p_a = \begin{bmatrix} p_{a1} \\ p_{a2} \\ \vdots \\ p_{aK} \end{bmatrix}, P_a = [p_1, p_2, \ldots, p_a] (a = 1, 2, \ldots, K) \quad (1\text{-}4)$$

$$t_a = Xp_a \quad (1\text{-}5)$$

$$X = T_K P_K^T = t_1 p_1^T + t_2 p_2^T + \ldots + t_K p_K^T \quad (1\text{-}6)$$

In addition, a residual matrix E (components of in rows correspond to detection values of the detectors, and components in columns correspond to the numbers of wafers) defined by equation (1-7) obtained by summing up the (a+1)th or higher high-order principal components having low degrees of contribution is formed. When the residual matrix E is applied to equation (1-6), equation (1-6) is expressed by equation (1-8). A residual score $Q_n$ of the residual matrix E is defined by (1-10) using a row vector $e_n$ defined by equation (1-9). In equation (1-10), $Q_n$ means the nth wafer.

$$E = t_{a+1} p_{a+1}^T + \ldots + t_K p_K^T \quad (1\text{-}7)$$

$$= \begin{bmatrix} e_{11} & e_{12} & \cdots & e_{1K} \\ e_{21} & e_{22} & \cdots & e_{2K} \\ \vdots & \vdots & \vdots & \vdots \\ e_{N1} & e_{N2} & \cdots & e_{NK} \end{bmatrix}$$

$$X = T_a P_a^T + E = t_1 p_1^T + t_2 p_2^T + \ldots + t_a p_a^T + E \quad (1\text{-}8)$$

$$e_n = [e_{n1}, e_{n2}, \ldots, e_{nK}] \quad (1\text{-}9)$$

$$Q_n = e_n e_n^T \quad (1\text{-}10)$$

The residual score $Q_n$ means a residual (error) of the nth wafer, and is defined by the equation (1-10). The residual score $Q_n$ is expressed by a product of the row vector $e_n$ and the transposed vector $e_n^T$ thereof. and is a sum of squares of residuals. The residual score $Q_n$ can be reliably calculated as a residual without canceling a plus component and a minus component. In this embodiment, an operation state is multilaterally decided and evaluated by calculating the residual score Q.

More specifically, when the residual score $Q_n$ of a certain wafer is different from a residual score $Q_o$ of a sampling wafer, when the components of the row vector $e_n$ are observed, it is understood that any detection value of the wafer has a large error in processing of the wafer. Therefore, a cause of abnormality can be specified.

In the rows (in the same wafer) of the residual matrix E, when analysis data having an error of residuals of the detectors is observed, a specific detection value having abnormality can be correctly confirmed in the wafer.

(Operation of Plasma Processing Apparatus)

An operation of the plasma processing apparatus 100 will be described below. In this embodiment, the plasma processing apparatus 100 acquires detection values from measuring units as analysis data each time plasma processing of one wafer is performed. These analysis data are stored in, e.g., The data storing means 211.

When the operation of the plasma processing apparatus 100 is started, the support member 103 moves downward to the lower chamber 101B of the processing chamber 101 through the ball screw mechanism 112, and the support member 103 carries a wafer W from the inlet/output port opened by the gate valve 106 to place the wafer W on the lower electrode 102. After the wafer W is carried, the gate valve 106 is closed, and the discharge system 119 operates to keep a state in the processing chamber 101 at a predetermined degree of vacuum. At this time, an He gas is supplied from the gas feeding mechanism 115 as a back gas at a center pressure of 20 Torr and an edge pressure of 40 Torr to increase heat conductivity between the wafer W and the lower electrode 102, more specifically, the electrostatic chuck 108 and the wafer W, so that cooling efficiency of the wafer W is improved. The temperature of the upper electrode is set at 60° C., the temperature of the lower electrode is set at 20° C., and the temperature of the side wall is set at 60° C.

On the other hand, a process gas is supplied from the process gas supply system 118. More specifically, an $NH_3$ gas is supplied at a predetermined flow rate. A pressure in the processing chamber 101 at this time is, e.g., 175 mT. In this state, a high-frequency power having 60 MHz and 2000 W is applied from the high-frequency power supply 104E to the upper electrode 104, and a high-frequency power of 2 MHz and 1800 W is applied from the second high-frequency power supply 107 to the lower electrode 102. In this manner, a plasma of the process gas is generated to perform etching process of a non-etching layer on the wafer W constituted by, e.g., a silicon substrate. Upon completion of the etching process, an operation opposite to the carry-in operation is performed to convey the processed wafer W out of the processing chamber 101. The same processes as described above are repeated to the subsequent wafers W, a predetermined number of wafers W are processed, and the series of processes are ended.

While the processes of the wafers W are performed, as analysis data, for example, the temperature and the like of the upper electrode 104, the wall surface of the upper chamber 101A of the processing chamber 101, and the lower electrode 102 are intermittently detected from the measuring units. The detection signals are sequentially input to the multivariate analysis means 200 through an A/D converter and stored in the data storing means 211 arranged in the multivariate analysis means 200.

In this embodiment, as the analysis data, the following data are used:

APC: divergence of APC valve 101D
C1_L: position of variable capacitor C1_L of rectifier 107A
C1_U: position of variable capacitor C1_U of rectifier 104D
C2_L: position of variable capacitor C2_L of rectifier 107A
C2_U: position of variable capacitor C2_U of rectifier 104D
EPD_A: light intensity of A wavelength (for example 387.5 nm)
EPD_B: light intensity of B wavelength (for example 260 nm)
EPD_DEF: derivative value of A wavelength/B wavelength
EPD_RAT: value of A wavelength/B wavelength
EAC_CIE: applied current of electrostatic chuck detected by the volt/ampere meter 109a
T_L: temperature of lower electrode 102
REF_L: reflected wave of high-frequency power applied to lower electrode 102
REF_U: reflected wave of high-frequency power applied to upper electrode 104
RF_Vpp: high-frequency voltage (RF voltage) Vpp on output side of rectifier 107A
T_U: temperature of upper electrode 104
T_W: temperature of side wall of processing chamber.

The light intensities of the A wavelength (for example, 387.5 nm) and the B wavelength (for example, 260 nm) are calculated by measurement performed by the spectroscope 120. The reflected wave of the high-frequency power applied to the lower electrode 102 is measured by a reflected wave measuring unit (not shown) arranged in the rectifier 107A. The reflected wave of the high-frequency power applied to the upper electrode 104 is measured by a reflected wave measuring unit (not shown) arrange in the rectifier 104D.

In this manner, a principal component analysis is performed to the analysis data obtained each time the wafers W are processes to calculate a residual score Q. When the residual score Q exceeds a predetermined value, the data is decided as abnormal data.

(Decision of Cause of Abnormality)

A method of deciding a specific parameter having abnormality in the analysis data which is decided as abnormal data in the decision of abnormality, for example, analysis data having a residual score Q which is exceeds a predetermined value will be described below.

Figure 3:
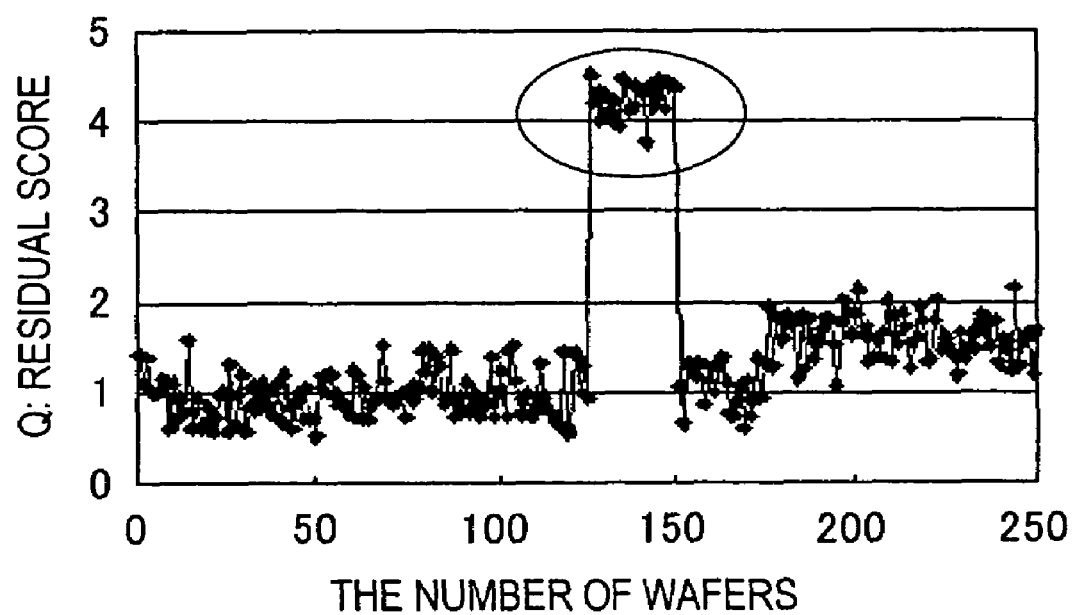
FIG. 3 is a graph of a residual score Q obtained when a model is formed by performing a principal component analysis to analysis data in the embodiment.

In this case, for example, the 1st to 125th wafers are subjected to a principal component analysis as sample wafers to form models, and residual scores Q of the 1st to 250th wafers are calculated are shown in FIG. 3. According to FIG. 3, the residual scores Q of the 126th to 150th wafers are largely shifted from the residual scores Q of the other wafers W, and the wafers can be decided as abnormal wafers.

In this manner, a cause obtained when the analysis data is decided as abnormal data can be specified by a contribution to the residual scores Q of the parameters of the analysis data contributed such that the residual scores Q exceeds the predetermined value. The contribution (in addition to the contribution, also called a contribution rate) mentioned here is used as a ratio representing a contribution of a change of specific contents to an entire change. In the embodiment, the contributions are contributions to the residual scores Q obtained by calculating differences between analysis data (for example, arbitrary analysis data decided as normal data)

and other analysis data with respect to parameters, and are obtained by accumulating normalized regression coefficients.

Figure 4A:
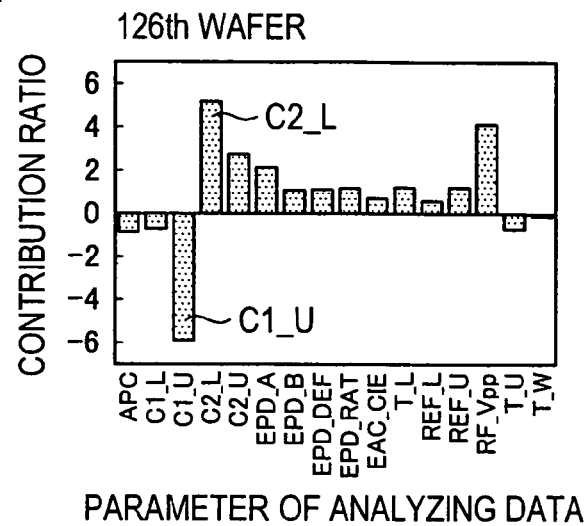
FIG. 4 is a graph of a contribution to the residual score Q with respect to analysis data in a wafer which is decided to be abnormal in the embodiment.
Figure 4B:
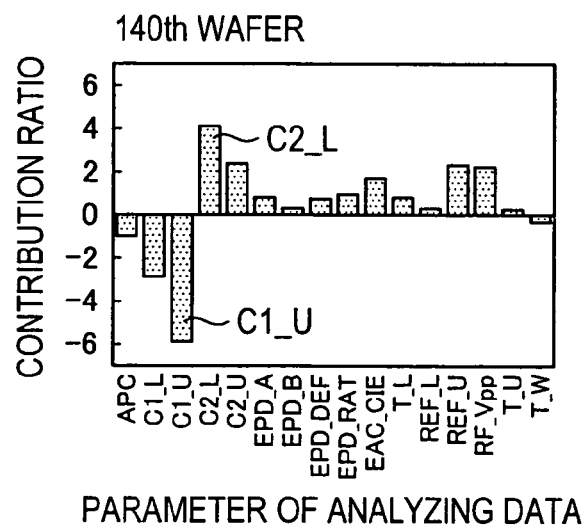
Figure 4C:
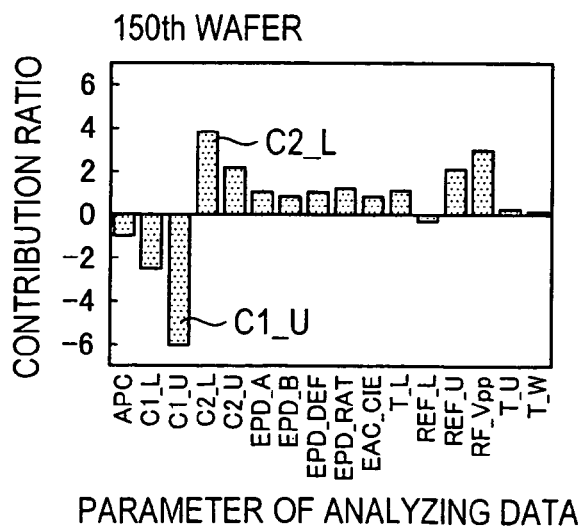

For example, of the analysis data of the wafers (126th to 150th wafers) which are decided as abnormal wafers shown in FIG. 3, contributions to the residual scores Q with respect to the parameters of the analysis data of the 126th, 140th, and 150th wafers are calculated and shown in FIGS. 4A, 4B, and 4c. In the bar graphs of the contributions, a wafer in which the absolute value of a contribution value is large highly contributes to a residual score Q. Therefore, according to, e.g., FIG. 4A, a parameter having the highest contribution is the parameter C1_U, and a parameter having the second highest contribution is the parameter C2_L.

In this manner, contributions of the parameters of the analysis data are calculated, a specific parameter which contributes such that the residual score Q exceeds the predetermined value, i.e., a parameter which causes abnormality can be found. In addition, it is understood that a parameter having a high contribution causes abnormality with high probability. For this reason, the parameters can be arranged in the descending order of probabilities of causing abnormality.

However, the lowest contribution of parameters which cause abnormality cannot be decided by only the contributions. For example, according to FIG. 4, it is understood that, since the parameters C1_U and C2_L have certainly high contributions, the parameters cause abnormality with high probability. However, the parameter Vpp having the next highest contribution is not decided as a parameter which causes abnormality.

With respect to this point, in order to decide (specify) a parameter as a cause of abnormality, it may be effective that a relation to the residual score Q is considered because it is sufficient that a cause of abnormality is removed such that the residual score Q is smaller than a predetermined value.

Therefore, in the present invention, the influences of only parameters having high contributions in the descending order of contributions are removed to sequentially calculate the residual scores Q. When the residual score Q is smaller than a predetermined value, a parameter from which an influence on the residual score Q is removed is decided as a parameter which causes abnormality.

More specifically, the residual scores Q obtained when the contributions of the parameters are 0 or a value close to 0 are sequentially calculated in a descending order of contribution of the parameters. When the residual score Q is lower than the predetermined value, a parameter having a contribution which is 0 or a value close to 0 is specified as a parameter which causes abnormality. In this manner, a parameter which causes abnormality can be specified.

A method of calculating a residual score Q while the contribution of a parameter is set at 0 or a value close to 0 will be described below. In general, the parameters of analysis data contribute to the residual scores Q while affecting each other. For this reason, a parameter is merely replaced with a value obtained when a parameter decided as a normal parameter by the residual score Q, the contribution of the parameter cannot be set at 0 or a value close to 0.

Figure 5A:
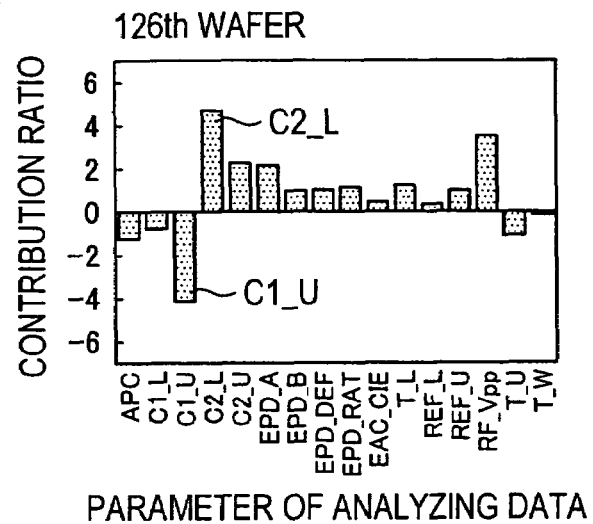
FIG. 5 is a graph of a contribution to the residual score Q when a parameter C1_U is simply replaced with an average value with respect to the analysis data in the wafer which is decided to be abnormal in the embodiment.
Figure 5B:
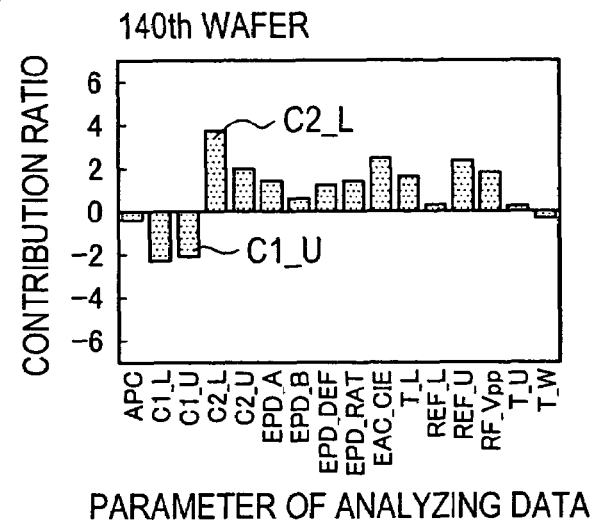
Figure 5C:
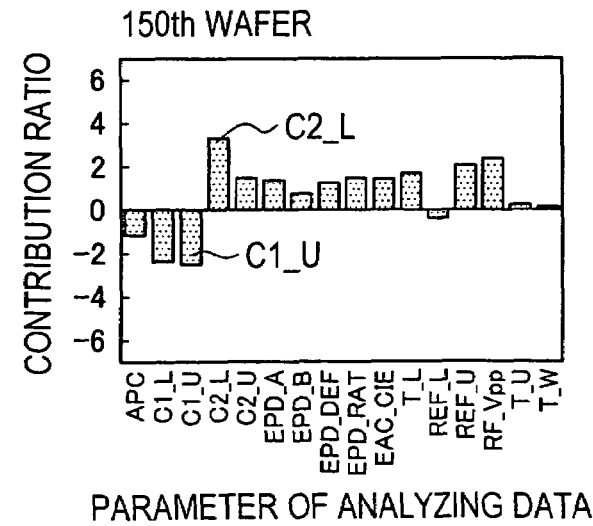

In the example shown in FIG. 3, all the parameters C1_U in the analysis data of the 126th, 140th, and 150th wafers which are decided as abnormal wafers by the residual scores Q are replaced with the average values of the parameters C1_U of the 1st to 125th wafers used as training wafers decided as normal wafers by the residual scores Q, and the contributions of the parameters are calculated again. The results are shown in FIG. 5. The obtained results are shown in FIGS. 5A, 5B, and 5C. FIGS. 5A, 5B, and 5C show bar graphs of the contributions of the parameters in the 126th, 140th, and 150th wafers. According to FIGS. 5A, 5B, and 5C, for example, the contribution of the parameter C1_U is kept at a high level on the minus side and rarely changes. In this manner, when the parameters are merely replaced with values obtained when the parameters are decided as normal parameters by the residual scores Q, only the contributions of the parameters cannot be set at 0 or a value close to 0.

Therefore, according to the present invention, of the parameters of analysis data, parameters having contributions to the residual scores Q which are desired to be set at 0 or a value close to 0 are predicted by a multivariate analysis, e.g., a PLS method to replace the values, and the values of the parameters are replaced with the predicted values. In this manner, the contributions to the residual scores Q of the parameters can be set at 0 or a value close to 0.

More specifically, the multivariate analysis means 200 sets, of the parameters of analysis data, a specific parameter having a contribution to the residual score Q which is desired to be set at 0 or a value close to 0 as a variate to be explained (target variate or target variable), and sets the other parameters as explaining variate (explaining variable). A correlation expression (prediction expression such as regression expression or model) of the following equation (2-1) is calculated by using a multivariate analysis program.

In the correlation expression given by the following equation (2-1), X means a matrix of explaining variates. The matrix X corresponds to parameters having contributions to the residual scores Q which are desired to be set at 0 or a value close to 0 are removed from the matrix X in equation (1-1). Reference symbol Y in the regression expression given by the following equation (2-1) means a matrix of variates to be explained. Reference symbol B means a regression matrix constituted by coefficients (weights) of the explaining variates, and reference symbol E means a residual matrix.

$$Y=BX+E \tag{2-1}$$

In the embodiment, when equation (2-1) is calculated, for example, a PLS (Partial Least Squares) method described in, e.g., JOURNAL OF CHEMOMETRICS, VOL. 2 (PP. 211 to 228) (1998) is used. According to this PLS method, even though the matrixes X and Y have a large number of explaining variates and a large number of variates to be explained, a relational expression between the matrix X and the matrix Y can be calculated by only small number of measured values of the matrixes X and Y. Furthermore, according to the characteristic features of the PLS method, even though the relational expression is obtained by a small number of measured values, high stability and high reliability can be achieved.

A program for the PLS method is stored in the multivariate analysis program storing means 201. The analysis means 212 processes analysis data according to the procedures of the program to calculate the correlation expression (2-1). The obtained result is stored in the analysis result storing means 205. Therefore, in the embodiment, when the correlation expression (2-1) is calculated, a parameter serving as an explaining variate in the analysis data is applied to the matrix X, so that a parameter serving as a target variate in the analysis data can be predicted. In addition, the predicted value has high reliability.

For example, an ith principal component corresponding to the ith characteristic value in an $X^TY$ matrix is expressed by $t_i$. When the score $t_i$ of the ith principal component and a vector pi are used, the matrix X is expressed by the following expression (2-2). When the score $t_i$ of the ith principal component and a vector $c_1$ are used, the matrix Y is expressed by the following equation (2-3). In the following equations (2-2) and (2-3), $X_{i+1}$ and $Y_{i+1}$ mean residual matrixes of the matrixes X and Y, respectively, and $X^T$ means a transposed matrix of the matrix X. In the following description, an index T means a transposed matrix.

$$X = t_1 p_1 + t_2 p_2 + t_3 p_3 + \ldots + t_i p_i + X_{i+1} \quad (2\text{-}2)$$

$$Y = t_1 c_1 + t_2 c_2 + t_3 c_3 + \ldots + t_i c_i + Y_{i+1} \quad (2\text{-}3)$$

The PLS method used in the first embodiment is a method of calculating a plurality of characteristic numbers and a plurality of characteristic vectors thereof obtained when equation (2-2) and equation (2-3) are correlated to each other with a small calculation amount.

The PLS method is performed by the following procedures. On the first stage, centering and scaling operations of the matrixes X and Y are performed. An equation i=1 is set, and $X_1 = X$ and $Y_1 = Y$ are satisfied. The first row of the matrix $Y_1$ is set as $u_1$. The centering operation is an operation which subtracts average values of the rows from the values of the rows, and the scaling operation is an operation (process) which divides the values of the rows by standard deviations of the rows, respectively.

On the second stage, after $w_i = X_i^T u_1 / (u_1^T u_1)$ is calculated, the determinant of $w_i$ is normalized to calculate $t_i = X_i w_i$. After the same process as described above is performed to the matrix Y to calculate $c_i = Y_1^T t_i / (t_1^T t_i)$, the determinant of $c_i$ is normalized to calculate $u_i = Y_1 c_i / (c_1^T c_i)$.

On the third stage, X loading (loading amount) $p_i = X_1^T t_i / (t_i^T t_i)$ and Y loading $q_i = Y_1^T u_i / (u^1 u_1)$ are calculated. An equation $b_i = u_i^T t_1 / (t_i^T t_1)$ obtained by regressing u to t is calculated. A residual matrix $X_i = X_i - t_i p_i^T$ and a residual matrix $Y_i = Y_i - b_i t_i c_i^T$ are calculated. The value i is incremented to set i=i+1, and the processes subsequent to the process on the second state are repeated. The series of processes are repeated according to the program of the PLS method until a predetermined stop condition is satisfied or until the residual matrix $X_{i+1}$ is converged to 0, and the maximum characteristic number of the residual matrix and the characteristic vector of the maximum characteristic number are calculated.

In the PLS method, the satisfaction of the stop condition for the residual matrix $X_{i+1}$ or the convergence to 0 are rapid. When the calculation is repeated about 10 times, the stop condition of the residual matrix is satisfied, or the residual matrix converged to 0. In general, when the calculation is repeated 4 to 5 times, the stop condition of the residual matrix is satisfied, or the residual matrix is converged to 0. The maximum characteristic number calculated by the calculation process and the characteristic vector of the characteristic number are used to calculate the first principal component of the $X^T Y$ matrix, and the maximum correlation between the matrix X and the matrix Y can be known.

When the correlative expression is obtained by the PLS method, a prediction value of a target variable can be calculated by merely applying an explaining variable to the correlative expression. In this manner, a prediction value of a specific parameter having a contribution to the residual score Q which is desired to be set at 0 or a value close to 0 can be calculated. When all the values of the specific parameters are replaced with prediction values, the contributions to the residual scores Q can be set at 0 or a value close to 0.

(Experiment Result)

An experiment result obtained when a contribution to a residual score Q is set at 0 or a value close to 0 by replacing parameters of analysis data with prediction values obtained by the PLS method will be described below. In the example shown in FIG. 3, contributions of parameters in analysis data of a wafer decided as abnormal wafer by residual scores Q are set at a value close to 0 by using prediction values obtained by the PLS method in a descending order of contribution to the residual scores Q to calculate new residual scores Q, and degrees of influence on the residual scores Q are examined.

With respect to the parameter C1_U having the highest parameter in the graph show in FIG. 4, the contribution is set at a value close to 0. More specifically, the parameter C1_U is set as a target variable, and other parameters are set as explaining variables. A correlative expression (2-1) between the parameter C1_U and the other parameters is calculated by the PLS method. In this case, the 1st to 125th wafers shown in FIG. 3 are used as training wafers, and the correlative expression (2-1) is calculated by the analysis data of these wafers.

With respect to the analysis data of the 126th to 150th wafers shown in FIG. 3, parameters except for the parameter C1_U are applied as explaining variables to the correlative expression (2-1), and prediction values of the parameters C1_U of the 126th to 150th wafers are calculated. Subsequentially, the values of only the parameters C1_U in the analysis data of the 126th to 150th wafers are replaced with the prediction values calculated as described above, respectively.

Figure 6A:
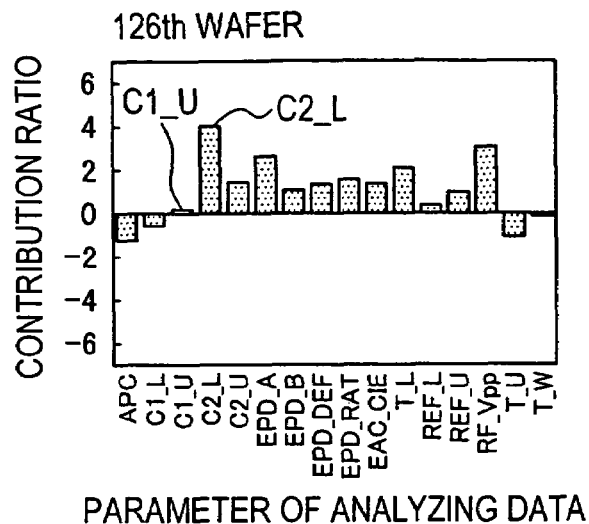
FIG. 6 is a graph of a contribution to the residual score Q when a degree of influence of the parameter C1_U having the highest contribution is removed with respect to the analysis data in the wafer which is decided to be abnormal in the embodiment.
Figure 6B:
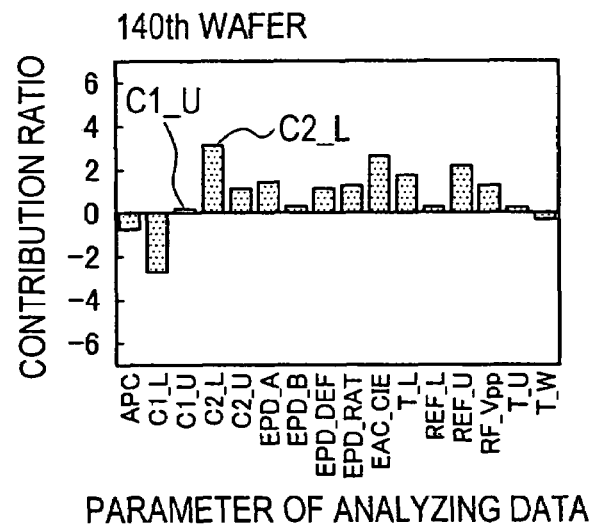
Figure 6C:
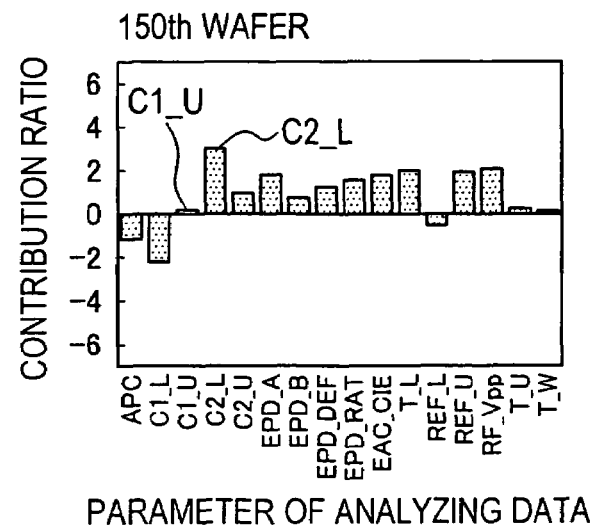

When a principal component analysis using the analysis data is performed by using the 1st to 125th wafers as training wafers to calculate contributions to residual scores Q, graphs shown in FIGS. 6A, 6B, and 6C are obtained. FIGS. 6A, 6B, and 6C show bar graphs of contributions calculated for the parameters of the 126th, 140th, and 150th wafers of wafers which are decided as abnormal wafers. According to FIGS. 6A, 6B, and 6C, unlike the case in FIG. 5 in which the values of the parameters C1_U are simply replaced with average values, it is understood that the contributions of the parameters C1_U are close to 0.

With respect to a parameter C2_L having a high contribution next to the contribution of the parameter C1_U in the graph shown in FIG. 4, a contribution to a residual score Q is set at a value close to 0. More specifically, the parameter C2_L is set as a target variable, and other parameters are set as explaining variables. A correlative expression (2-1) between the parameter C2_L and the other parameters is calculated by the PLS method. In this case, the 1st to 125th wafers shown in FIG. 3 are used as training wafers, and the correlative expression (2-1) is calculated by the analysis data of these wafers. As the parameters C1_U in the explaining variables, the parameters which are changed into prediction values in the analysis data are directly used. This is because the influence of the parameter C2_L is removed while removing the influence on the residual score Q of the parameter C1_U.

With respect to the analysis data of the 126th to 150th wafers shown in FIG. 3, parameters except for the parameter C2_L are applied as explaining variables to the correlative expression (2-1), and prediction values of the parameters C2_L of the 126th to 150th wafers are calculated. Subsequentially, the values of only the parameters C2_L in the analysis data of the 126th to 150th wafers are replaced with the prediction values calculated as described above, respectively like the parameters C1_U.

Figure 7A:
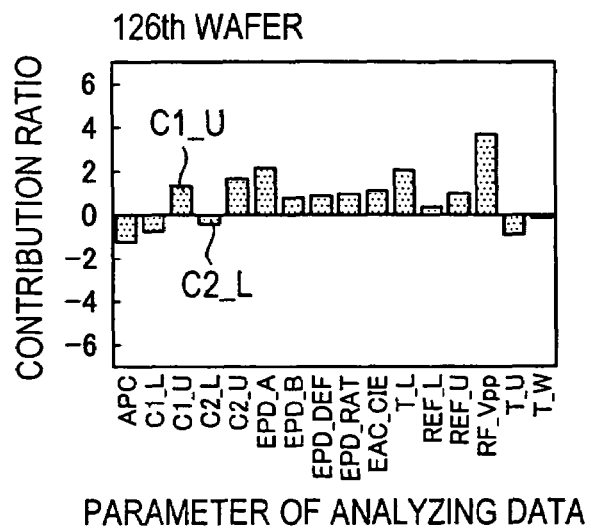
FIG. 7 is a graph of a contribution to the residual score Q when a degree of influence of a parameter C2_L having the next highest contribution is removed with respect to the analysis data in the wafer which is decided to be abnormal in the embodiment.
Figure 7B:
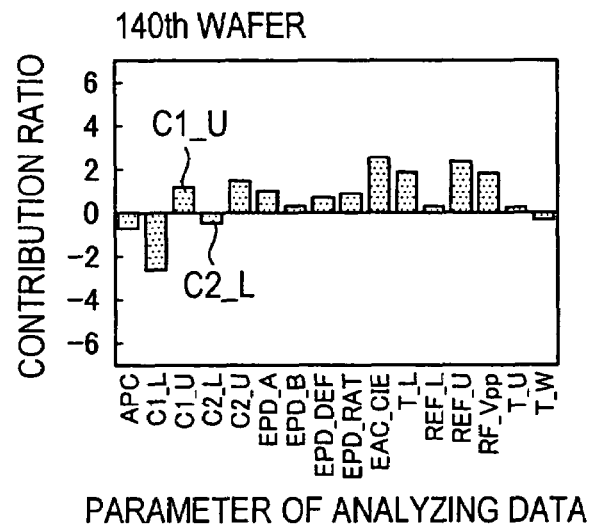
Figure 7C:
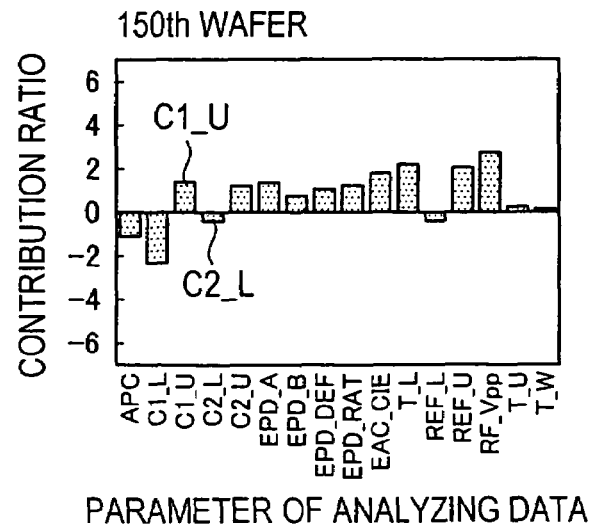

When a principal component analysis using the analysis data is performed to the 1st to 125th wafers to calculate contributions to residual scores Q of the 126th, 140th, and 150th wafers which are decided as abnormal wafers, graphs shown in FIGS. 7A, 7B, and 7C are obtained. FIGS. 7A, 7B, and 7C show bar graphs of contributions calculated for the parameters of the 126th, 140th, and 150th wafers of the wafers which are decided as abnormal wafers. According to FIGS. 7A, 7B, and 7C, it is understood that the contributions of the parameters $C1\_U$ and $C2\_L$ are close to 0.

(Decision of Parameter Specified as Cause of Abnormality)

A method of deciding a parameter which causes abnormality and has the lowest contribution will be described below. When a parameter is decided as an abnormal parameter by a residual score Q, influences on the residual score Q are sequentially removed in a descending order of contribution to the residual score Q to calculate a new residual score Q. On the basis of the newly calculated residual score Q, a parameter specified as a cause of abnormality is decided.

More specifically, until the residual score Q is a predetermined value or less at which a parameter is decided as a normal parameter, the contributions of parameters are set at 0 or a value close to 0 in a descending order of contribution to the residual score Q. When the residual score Q is the predetermined value or less at which the parameter is decided as a normal parameter, the parameters having contributions which are set at 0 or a value close to 0 until now are decided as parameters which cause abnormality.

Figure 8:
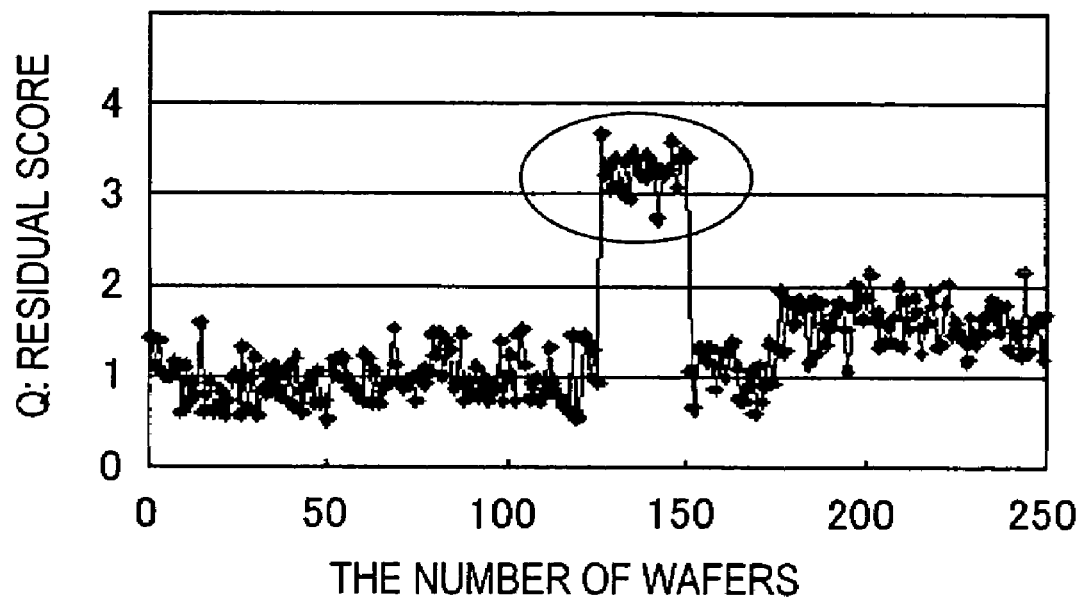
FIG. 8 is a graph of the residual score Q when the degree of influence of the parameter C1_U having the highest contribution is removed in the embodiment.

In the example shown in FIG. 3, a case in which a new residual score Q is calculated while removing influences of parameters in a descending order of contribution to a residual score will be described below with reference to the drawings. FIG. 8 shows a case in which the contribution of the parameter $C1\_U$ is set at a value close to 0 as shown in FIG. 6 to calculate a new residual score Q. More specifically, the values of only the parameters $C1\_U$ in the analysis data of the 126th to 150th wafers are replaced with prediction values calculated by the PCA method to calculate a new residual score Q.

As is apparent from FIG. 8, with respect to the 126th to 150th wafers which are decided as abnormal wafers, the residual scores Q are smaller than the residual scores Q shown in FIG. 3. This means that the residual scores Q changes to be better when the influences on the residual scores Q of the parameters $C1\_U$ are removed.

According to FIG. 8, when a predetermined value (decision reference) at which the residual score Q is decided as a normal score is 4 or less, the residual scores Q of the 126th to 150th wafers are the predetermined value or less, and the wafers are decided as normal wafers. Therefore, when the decision reference is set, it can be specified that only the parameter $C1\_U$ of the analysis data is abnormal. In this case, it is satisfied to perform repair or maintenance based on the parameter $C1\_U$, e.g., an exchange of rectifiers.

In contrast to this, when the predetermined value (decision reference) at which the residual score Q is decided as a normal score is 3 or less, the residual scores Q of the 126th to 150th wafers exceed the predetermined value, and the wafers are decided as abnormal wafers. In this case, a parameter specified as a cause of abnormality is not only the parameter $C1\_U$. For this reason, with respect to a parameter having a high contribution next to the contribution of the parameter $C1\_U$, the contribution must be set at 0 or a value close to 0 to calculate a new residual score Q.

Figure 9:
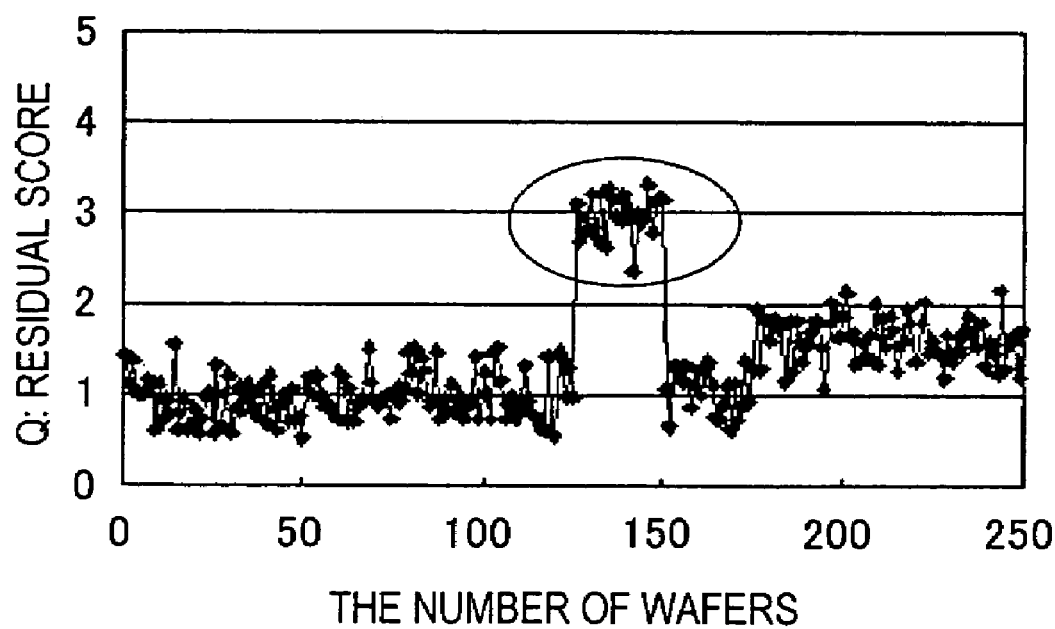
FIG. 9 is a graph of the residual score Q when the degree of influence of the parameter C2_L having the next highest contribution is removed in the embodiment.

Therefore, in the embodiment, since a parameter having a high contribution next to the contribution of the parameter $C1\_U$ is the parameter $C2\_L$ (see FIG. 4), with respect to the parameter $C2\_L$, the contribution is set at 0 or a value close to 0 to calculate a new residual score Q. FIG. 9 shows a case in which the contribution of the parameter $C2\_L$ is set at a value close to 0 as shown in FIG. 7 to calculate a new residual score Q. More specifically, the values of only the parameters $C2\_L$ in the analysis data of the 126th to 150th wafers are replaced with prediction values calculated by the PCA method to calculate a new residual score Q.

As is apparent from FIG. 9, with respect to the 126th to 150th wafers which are decided as abnormal wafers, the residual scores Q are smaller than the residual scores Q shown in FIG. 8. This means that the residual scores Q changes to be better when the influences on the residual scores Q of the parameters $C1\_U$ and $C2\_L$ are removed.

According to FIG. 9, when a predetermined value (decision reference) at which the residual score Q is decided as a normal score is, for example, 3 or less, the residual scores Q of the 126th to 150th wafers are the predetermined value or less, and the wafers are decided as normal wafers. Therefore, when the decision reference is set, it can be specified that not only parameter $C1\_U$ but also the parameter $C2\_L$ of the analysis data are abnormal. Therefore, in this case, it is satisfied to perform repair or maintenance based on the parameters $C1\_U$ and $C2\_L$, and repair or maintenance based on the other parameters need not be performed.

In the embodiment, with respect to parameters of analysis data decided as abnormal data, contributions to, e.g., a residual score Q are calculated as degrees of influence on the abnormality (degree-of-influence calculation step and degree-of-influence calculation means), the contributions of the parameters are set at 0 or a value close to 0 in a descending order of contribution of the parameters to sequentially calculate residual scores Q. When the residual scores Q are a predetermined value or less, the parameters having contributions which are set at 0 or a value close to 0 are decided as parameters which cause abnormality (cause-of-abnormality deciding step and cause-of-abnormality deciding means). In this manner, since the parameters can be specified depending on the residual scores Q, parameters which cause abnormality can be appropriately decided. For this reason, since repair and maintenance which are necessary to decide analysis data as normal data can be appropriately performed, the repair and the maintenance can be efficiently performed.

With respect to a parameter from which a degree of influence on abnormality, a correlation between the specific parameter and the other parameters is calculated by a multivariate analysis, e.g., the PLS method. A prediction value of the specific parameter is calculated on the basis of the correlation, the value of the specific parameter is replaced with the prediction value. In this manner, the contribution of the specific parameter can be easily set at 0 or a value close to 0 without forming a new special computing method. However, the contribution of the specific parameter may be set at 0 or a value close to 0 by using a special computing method.

The preferred embodiment of the present invention has been described above with reference to the accompanying drawings. However, the present invention is not limited to the embodiment, as a matter of course. It is apparent to a person skilled in the art that various changes and modifications can be conceived in the spirit and scope of the present invention. It is understood that the various changes and modifications belong to the spirit and scope of the invention.

For example, as the plasma processing apparatus, not only a parallel-piped plasma processing apparatus, but also a helicon wave plasma processing apparatus, an inductive coupling plasma processing apparatus, and the like may be used.

As the analysis data, in addition to the data used in the embodiment, VI probe data, optical data, or trace data may be used. As another trace data, gas flow rates measured by the mass flow controller 118B, a gas pressure of a back-side gas detected by a pressure meter 115B, a voltage Vdc between a high-frequency power supply line (electric wire) and the ground as a measured value in the rectifier 107A, and a measured value (traveling wave or the like of a high-frequency power) in the electric measuring unit (VI probe) 107C are cited.

The case in which a wafer W is etched has been described above. However, the present invention can also be applied to not only an etching process but also a processing apparatus which performs a film forming process or the like. The wafer W is not limited to a wafer to be processed.

As has been described above, according to the present invention, there is provided a method and apparatus for deciding a cause of abnormality in a plasma processing apparatus. The method and apparatus for deciding a cause of abnormality can appropriately specify parameters of analysis data which causes abnormality and can appropriately perform repair and maintenance which are necessary to decide the analysis data as normal data.

What is claimed is:

1. A method of deciding a cause of abnormality in a plasma processing apparatus which performs a plasma processing to an object to be processed in a processing chamber, comprising:
   an analysis data acquiring step of acquiring analysis data constituted by a plurality of parameters on the basis of detection values obtained in processes for the object from a detector arranged in the plasma processing apparatus;
   an abnormality deciding step of analyzing the acquired analysis data to decide whether the analysis data is abnormal or not;
   a degree-of-influence calculating step of calculating degrees of influence on the abnormality of each parameter of the analysis data decided as abnormal data; and
   a cause-of-abnormality deciding step of deciding whether the analysis data is abnormal or not after removing the influences on the abnormality from the parameter sequentially in the descending order of the degrees of influence of the parameters, and then deciding the parameters from which the influences on the abnormality are removed up to now as parameters which cause the abnormality when it is decided that the analysis data is normal.

2. The method of deciding a cause of abnormality in a plasma processing apparatus according to claim 1, wherein
   the abnormality decision step has the step of performing a principal component analysis to the acquired analysis data to calculate a residual score, and the step of deciding the analysis data having the residual score which is exceeds a predetermined value as abnormal data,
   the degree-of-influence calculating step calculates contributions to the residual score as degrees of influence on abnormality with respect to each parameter of the analysis data decided as abnormal data, and
   the cause-of-abnormality deciding step sets contributions of the parameters at 0 or a value close to 0 in a descending order of contribution of the parameters to sequentially calculate residual scores, and, when the residual scores are not more than the predetermined value, decides the parameters having the contributions which are set at 0 or a value close to 0 until now as parameters which cause abnormality.

3. The method of deciding a cause of abnormality in a plasma processing apparatus according to claim 2, wherein, in the cause-of-abnormality deciding step, in order to set the contribution of a specific parameter at 0 or a value close to 0, a correlation between the specific parameter and other parameters is calculated by a multivariate analysis, a prediction value of the specific parameter is calculated on the basis of the correlation, and the value of the specific parameter is replaced with the prediction value.

4. The method of deciding a cause of abnormality in a plasma processing apparatus according to claim 3, wherein, the multivariate analysis is a partial least squares method.

5. An apparatus for deciding a cause of abnormality in a plasma processing apparatus which performs a plasma processing to an object to be processed in a processing chamber, comprising:
   analysis data acquiring means for acquiring analysis data constituted by a plurality of parameters on the basis of detection values obtained in processes for the object from a detector arranged in the plasma processing apparatus;
   abnormality deciding means for analyzing the acquired analysis data to decide whether the analysis data is abnormal or not;
   degree-of-influence calculating means for calculating degrees of influence on the abnormality of each parameter of the analysis data decided as abnormal data; and
   cause-of-abnormality deciding means for deciding whether the analysis data is abnormal or not after removing the influences on the abnormality from the parameter sequentially in the descending order of the degrees of influence of the parameters, and then deciding the parameters from which the influences on the abnormality are removed up to now as parameters which cause the abnormality when it is decided that the analysis data is normal.

6. The apparatus of deciding a cause of abnormality in a plasma processing apparatus according to claim 5, wherein
   the abnormality decision means performs a principal component analysis to the acquired analysis data to calculate a residual score and decides the analysis data having the residual score which is exceeds a predetermined value as abnormal data,
   the degree-of-influence calculating means calculates contributions to the residual score as degrees of influence on abnormality with respect to each parameter of the analysis data decided as abnormal data, and
   the cause-of-abnormality deciding means sets contributions of the parameters at 0 or a value close to 0 in a descending order of contribution of the parameters to sequentially calculate residual scores, and, when the residual scores are not more than the predetermined value, decides the parameters having the contributions which are set at 0 or a value close to 0 until now as parameters which cause abnormality.

7. The apparatus of deciding a cause of abnormality in a plasma processing apparatus according to claim 6, wherein, in the cause-of-abnormality deciding means, in order to set the contribution of a specific parameter at 0 or a value close to 0, a correlation between the specific parameter and other parameters is calculated by a multivariate analysis, a prediction value of the specific parameter is calculated on the basis of the correlation, and the value of the specific parameter is replaced with the prediction value.

8. The apparatus of deciding a cause of abnormality in a plasma processing apparatus according to claim 7, wherein, the multivariate analysis is a partial least squares method.

* * * * *

UNITED STATES PATENT AND TRADEMARK OFFICE
CERTIFICATE OF CORRECTION

PATENT NO. : 7,389,203 B2  Page 1 of 1
APPLICATION NO. : 10/849307
DATED : June 17, 2008
INVENTOR(S) : Hideki Tanaka It is certified that error appears in the above-identified patent and that said Letters Patent is hereby corrected as shown below:

On the title page, item (74), line 2, "Farrabow," should read --Farabow,--.

In claim 2, column 17, line 62, "which is exceeds" should read --which exceeds--.

In claim 6, column 18, line 50, "which is exceeds" should read --which exceeds--.

Signed and Sealed this

Sixteenth Day of December, 2008

JON W. DUDAS
*Director of the United States Patent and Trademark Office*